(12) United States Patent
Natarajan et al.

(10) Patent No.: US 7,407,883 B2
(45) Date of Patent: Aug. 5, 2008

(54) ELECTRONIC PACKAGE WITH IMPROVED CURRENT CARRYING CAPABILITY AND METHOD OF FORMING THE SAME

(75) Inventors: Govindarajan Natarajan, Poughkeepsie, NY (US); Raschid J Bezama, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 109 days.

(21) Appl. No.: 11/529,027

(22) Filed: Sep. 28, 2006

(65) Prior Publication Data
US 2007/0045816 A1  Mar. 1, 2007

Related U.S. Application Data

(62) Division of application No. 10/752,176, filed on Jan. 6, 2004, now Pat. No. 7,332,805.

(51) Int. Cl.
*H01L 21/44* (2006.01)
(52) U.S. Cl. ............... 438/652; 438/107; 438/108
(58) Field of Classification Search ............ 438/107, 438/108, 121, 125, 652, 666, 668, 669, 672
See application file for complete search history.

(56) References Cited

U.S. PATENT DOCUMENTS

| | | | |
|---|---|---|---|
| 3,948,706 A | 4/1976 | Schmeckenbecher | |
| 3,956,052 A | 5/1976 | Koste et al. | |
| 4,521,449 A | 6/1985 | Arnold et al. | |
| 4,753,694 A | 6/1988 | Herron et al. | |
| 4,866,507 A | 9/1989 | Jacobs et al. | |
| 5,127,986 A | 7/1992 | August et al. | |
| 5,185,502 A | 2/1993 | Shepherd et al. | |
| 5,240,671 A | 8/1993 | Carey | |
| 5,309,629 A | 5/1994 | Traskos et al. | |
| 5,691,572 A * | 11/1997 | Chung | 257/751 |
| 5,846,361 A * | 12/1998 | Fasano et al. | 156/89.16 |
| 6,090,703 A | 7/2000 | Bandyopadhyay et al. | |
| 6,127,264 A | 10/2000 | Bandyopadhyay et al. | |
| 6,350,334 B1 * | 2/2002 | Shigemi et al. | 156/89.12 |
| 6,350,957 B1 | 2/2002 | Shingai et al. | |
| 6,353,261 B1 | 3/2002 | Weling | |
| 6,359,329 B1 | 3/2002 | Kikuta | |
| 6,388,207 B1 | 5/2002 | Figueroa et al. | |
| 6,423,558 B1 | 7/2002 | Maeda et al. | |
| 6,815,046 B2 * | 11/2004 | Mandai et al. | 428/210 |
| 6,919,637 B2 | 7/2005 | He et al. | |
| 7,345,807 B2 * | 3/2008 | Malone | 359/291 |

FOREIGN PATENT DOCUMENTS

JP         48-34674         5/1973

* cited by examiner

*Primary Examiner*—Kevin M Picardat
(74) *Attorney, Agent, or Firm*—DeLio & Peterson, LLC; Kelly M. Nowak; Joseph Petrokaitis

(57) ABSTRACT

An electronic package and method for forming such package that expands the current capability of lines and/or reducing line resistance for packages with a given feature dimension while relaxing feature tolerances. The methods and structures include electrical wirings having regions of larger wire cross-sectional areas in locations where the package must supply higher current distribution to the electronic devices and/or where signal lines need lower electrical resistance. These larger wire cross-sectional areas are vertically extended conductors applied to either the entire conductor or portions of the conductor.

20 Claims, 9 Drawing Sheets

ELECTRONIC PACKAGE WITH IMPROVED CURRENT CARRYING CAPABILITY AND METHOD OF FORMING THE SAME

BACKGROUND OF THE INVENTION

1. Field of the Invention

The present invention relates in general to MLC substrates for packaging electronic devices, and more particularly, to methods and structures with electrical wiring having regions of larger wire cross-sectional areas in those locations where the package must supply higher current distribution to the electronic devices and/or where signal lines need lower electrical resistance.

2. Description of Related Art

In the ceramic electronics industry, multilayer ceramic (MLC) technology is typically used to create three-dimensional circuitry for microelectronic devices such as integrated circuits and ceramic capacitors. These three-dimensional circuitries are made by applying a conductive material in a circuit pattern on a ceramic/polymer composite sheet known as a green sheet.

A green sheet may have a number of via holes punched in it to allow vertical connection between the conductive material on adjacent sheets, whereby after the vias are punched in the sheets, the green sheet is screened and patterned by applying a conductive paste into the via holes and along the surface of the green sheet. A number of via punched and screened green sheets are then stacked in a designated order and laminated together under appropriate heat and pressure to form a laminate which can be handled as a unified structure. The laminated ceramic/polymer composite is heated to remove the polymer, and then heated to a higher temperature to sinter and densify the ceramic, thereby forming the final MLC.

Over the years, generations of MLC technology have developed to incorporate advanced technologies, including, reduced grid and feature dimensions to satisfy the needs of advanced integrated circuits, IC's, of continuously increasing complexity, that require increasing interconnection capability, higher interconnection density, higher power density, and operate at increasingly higher frequency. Yet, these ever shrinking state of the art packages carry with them the problem of limited current carrying capability, which in turn, leads to an undesirable increase in resistance across the electronic package.

Current capability is a function of the metal wiring type and line width, as well as the thickness and line length of the wire. In electronic packaging, the wiring line width and thickness are typically dependent on the technology used to build the package. For instance, in both MLC and organic packaging, such wiring dimensions are designed by the manufacturing process utilized to build the MLC or organic package. In addition, wire dimensions limit the maximum size of an electronic package mainly because the wire maximum length defines the wire total resistance and this total resistance is always specified to given maximum, usually in the 2 to 4 Ohms. But the package size also has impact on the package interconnecting capability, defined as the maximum number of independent signal lines that a given package can provide to interconnect between a point on the package top surface and the package bottom surface. This package interconnecting capability is typically proportional to the package surface area, and a function of the minimum spacing between surface electrical interconnecting pads, or I/O's.

Yet, with advanced electronic packaging technologies, the dimensions and operating voltages thereof continually diminish in size while the requirements of local current densities for power distribution and/or reduced line resistance for signal wiring continue to increase. This combined need for an increase in power dissipation within a smaller packaging component poses significant problems in the fabrication of such packages, as well as imposes restrictions on feature tolerances and maintaining a tolerable resistance As future generations of electronic packages are required to have reduced grid and feature dimensions and increased power density, this grid reduction drives the need for improved approaches of reducing resistance. As such, a need continues to exist in the art for faster electronic packages having increased interconnecting capability, smaller features, reduced resistance, and methods for forming the same.

SUMMARY OF THE INVENTION

Bearing in mind the problems and deficiencies of the prior art, it is therefore an object of the present invention to provide an electronic package and method for forming such package that expands the current capability of lines and/or reducing line resistance for packages with a given feature dimension while relaxing some of the feature tolerances.

The above and other objects and advantages, which will be apparent to one of skill in the art, are achieved in the present invention, which is directed to, in a first aspect, a method of forming an electronic package for mounting integrated circuits. The method includes providing a grid that matches an integrated circuit, the grid having a conductor having a cross section normal to the length of the conductor, and vertically extending at least a portion of the cross section of the conductor by providing a first dielectric layer. An opening is formed in the first dielectric layer corresponding to at least a portion of the length of the conductor. Metallurgy is deposited over the surface of the first dielectric layer to fill the opening. The first dielectric is then attached to the grid such that the filled opening is aligned to the existing conductor for vertically extending the cross section of the conductor.

The method may further include, providing a second dielectric layer and forming an opening therein. The first and second dielectric layers are positioned such that the opening in the first dielectric layer is aligned to the opening in the second dielectric layer. The first and second dielectric layers are attached to each other to form a single, laminated dielectric layer having an aperture. The metallurgy is deposited to fill this aperture, and then the laminated dielectric layer is attached to the integrated circuit such that the filled aperture is aligned to the existing conductor for vertically extending the cross section of the existing conductor into the laminated dielectric layer.

Optionally, the method may include forming a vertically extended opening in the first dielectric layer by forming a second opening in a location corresponding to and above the first opening. This second opening may be larger than the first opening. The metallurgy is then deposited over the first dielectric layer to fill the vertically extended opening. The first dielectric layer is attached to the grid such that the filled vertically extended opening is aligned to the existing conductor for vertically extending the cross section of the conductor.

Alternatively, the method may include providing second, third and fourth dielectric layers. These layers are positioned such that the second layer is over the third and the third layer is over the fourth. An extended channel opening is formed in the middle, third dielectric layer, and metallurgy applied to the second and fourth dielectric layers. The second, third and fourth dielectric layers are then attached to each other to form a vertically extended line layer such that the metallurgy is extruded into the extended channel opening to form an extended conductor line within this vertically extended line layer. The vertically extended line layer is then attached to the integrated circuit such that the extended conductor line is aligned to at least one of the filled opening or the conductor for vertically extending the conductor cross section.

In another aspect, the invention is directed to a package for mounting integrated circuits containing wiring. This package at least includes a grid for an integrated circuit having an existing conductor with a cross section and a dielectric layer of the integrated circuit grid. The dielectric layer has a vertical metal trench positioned in a location corresponding to the existing conductor. A vertically extended conductor of the package comprises the existing conductor in combination with the vertical metal trench.

In yet another aspect, the invention is directed to a grid structure for an integrated circuit. This structure includes a planar dielectric layer in contact with interconnecting vias for a specified grid and vertically extended conductor within the dielectric layer located between the interconnecting vias. The conductor has a length extending in the plane of the dielectric layer, a width in the plane of the dielectric layer normal to the length, and a height normal to the width and the plane of the dielectric layer. The vertically extended conductor has a height to width ratio equal to or greater than 0.5. At least a portion of the height of the vertically extended conductor may be formed in an opening in the dielectric layer between the vias.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

Figure 1:
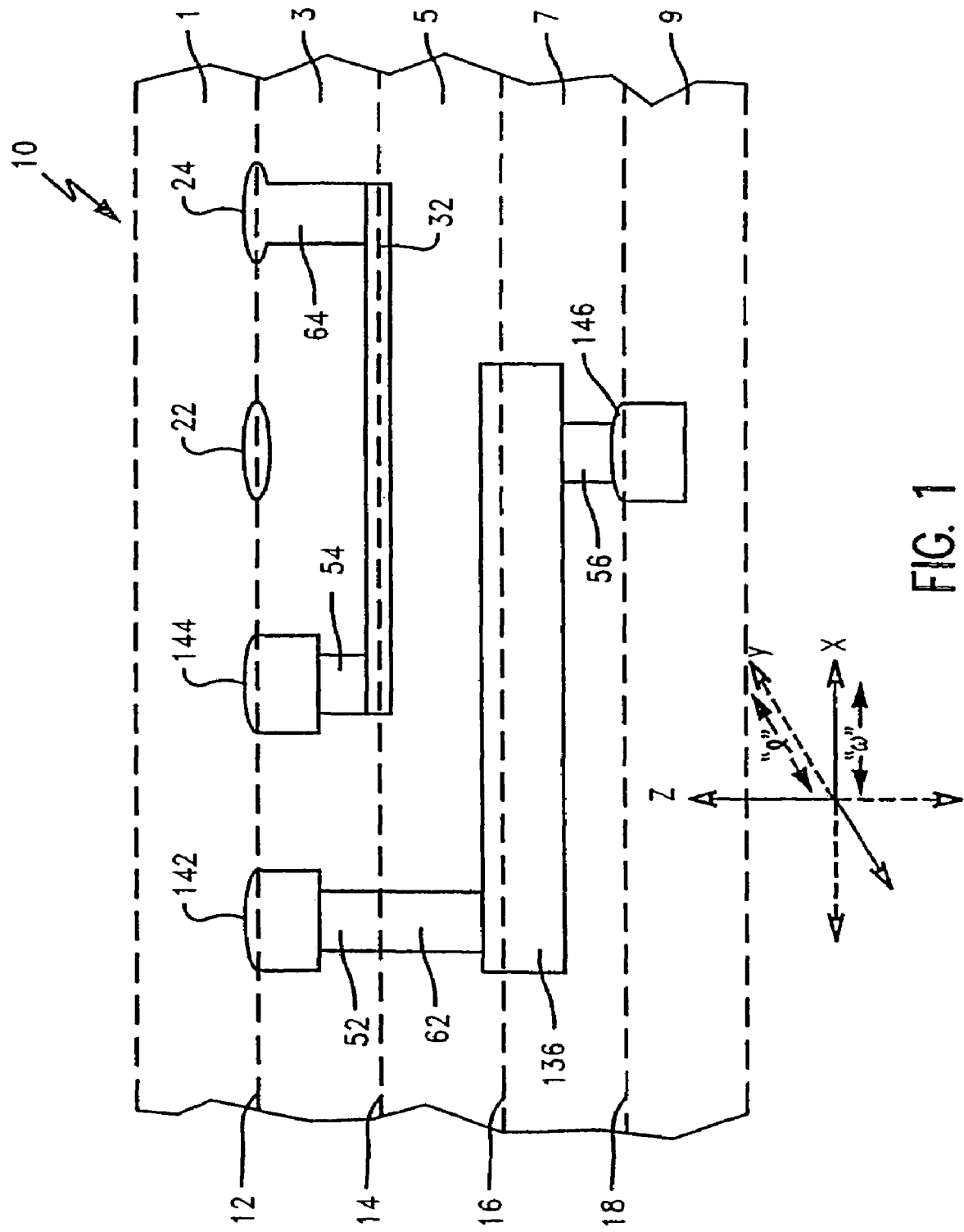
FIG. 1 is a vertical cross sectional view of a multilayer ceramic (MLC) of the invention having electrical wiring with regions of larger wire cross-sectional areas in locations where a higher current distribution must be supplied to electronic devices.

DESCRIPTION OF THE PREFERRED
EMBODIMENT(S)

In describing the preferred embodiment of the present invention, reference will be made herein to FIGS. 1-8B of the drawings in which like numerals refer to like features of the invention. Features of the invention are not necessarily shown to scale in the drawings.

The present invention is directed to a method and a package having significantly increased wiring cross-sections for mounting integrated circuits containing wiring. The package may be a multilayer ceramic (MLC) package or an organic package comprised of any of a variety of metal/dielectric system materials. The metals in these packages may comprise copper, silver, tungsten and nickel. The dielectrics in these packages may comprise ceramics such as glass ceramics, alumina, aluminum nitride and borosilicates. Examples of such packages include, but are not limited to, alumina/Mo, alumina/Cu, and the like.

In accordance with the invention, a wiring cross section is increased at least vertically, i.e., in the z-direction, such that this vertically increased wire cross section allows voltage planes to carry increased current load to regions or locations with a higher power demand and/or requirement. The invention is preferably performed on an existing conductor during line fabrication, such that this existing conductor is vertically extended. This extended cross-sectional area can be applied to the entire conductor, i.e., line, or just at places where the line width is limited by the presence of other features such as other lines or vias. To vertically extend a cross section of a given conductor, at least one opening is formed in a dielectric layer and the metallurgy deposited over the package dielectric. The trench can be machined before or after vias are fabricated by any of many machining methods. Alternatively, the line trench can be machined by adding an additional dielectric thin layer to the structure with the trench already fabricated into the thin layer. Vias can be machined before or after this step.

The extension is done in a vertical direction, and hence, there is no need to change existing feature tolerances, however, new tolerances may be introduced through these vertically extended conductors. This vertical extension of the wire cross section also expands the current carrying capability of lines and/or reduces line resistance for packages with a given feature dimension and density, while simultaneously relaxing certain feature tolerances. The vertical wiring cross section expansion in accordance with the invention is particularly useful for those future generations of electronic packages having significantly reduced grid and feature dimensions.

Referring now to the drawings, the illustrations of FIGS. 1-8B depict an MLC electronic package of the invention; however, it should be appreciated that the present invention may be used to form a plurality of differing electronic packages including, but not limited to, MLC and organic.

As shown in FIG. 1, a MLC substrate 10 is shown having a number of differing metallized and sintered ceramic layers, namely, multi-layers 1, 3, 5, 7, and 9. The approximate location of four interfaces 12, 14, 16, and 18, between layers is also shown in this cross-section for the purpose of providing a frame of reference when describing the details of this invention, but it should be appreciated that a real cross-section of a ceramic substrate will not show such clearly defined interface lines. Shown in FIG. 1 are several metallurgical features, namely a plurality of conductors and interconnecting vias, shown with different shadow grading and described below, surrounded by the dielectric matrix. While the description of this invention will be done using ceramic as dielectric matrix, it should be understood that other suitable non-ceramic dielectric materials can also be used to build the same structure described here.

Referring now to the metallurgical features shown in FIG. 1, interface 12 shows two conventional conductors 22 and 24 and a conventional line 32, with traditional cross-section running perpendicular and parallel, respectively, to the given view. Also shown are vertically extended conductors 142, 144 and 146 of the invention that have lengths that run into the y-direction (perpendicular to the plane of the drawing in the given view), as well as vertically extended conductive line 136 of the invention that runs parallel in the x-direction. As is shown, vertically extended conductors 142 and 144 are located at interface 12, vertically extended conductive line 136 at interface 16 and vertically extended conductor 146 at interface 18.

In accordance with the invention, the vertically extended conductors 142, 144, 146, 136 have cross sections that are extended at least vertically, in the z-direction, and optionally simultaneously horizontally, in the x, y-directions. The extension of conductors 142, 144, 146, 136 of the invention advantageously provide for increased current carrying capability as compared to the conventional conductors 22, 24 and 32. This increase in current carrying capability is proportional to the increase or extension in cross-sectional directions of the present conductors 142, 144, 146, 136.

As is further shown in FIG. 1, a plurality of interconnecting vias 52, 54, 56, 62, 64 are provided for electrical interconnection between conventional conductors 24 and 32 and the present vertically extended conductors 142, 144, 146, 136. These vias make the electrical interconnection between these plurality of conductors and lines shown at the different interface levels. Short vias 52 and 54 and long via 64 provide electrical interconnection between selected metallurgy of interface 12 and metallurgy of interface 14. Long via 62 interconnects connectors at interfaces 14 and 16, while short via 56 connects extended conductor 136 at interface 16 with extended conductor 146 at interface 18. Preferably, the diameter of short vias is equal to the diameter of long vias to simplify the manufacturing process.

Thus, the present vertically extended conductors 142, 144, 146, 136 may be connected to both other extended conductors 142, 144, 146, 136 of the invention, as well as with conventional conductors 22, 24, 32. For example, conductor 142 at interface 12 is electrically connected to extended cross-section conductor 146 through short via 52, long via 62, connector 136, and short via 56. Also, extended cross-section connector 144 is electrically connected to conventional cross-section connector 24 through short via 54, conventional cross-section connector 32, and long via 64.

In addition to increasing current carrying capability, the vertically extended cross-section conductors of the invention have the advantage of reducing line capacitance for a given current capability. For example, to double the current carrying capability of a conventional conductor, such as one having dimensions of 100 microns width by 25 microns height and 150 microns away from any voltage plane, traditionally requires an increase of the conductor width to 200 microns while preserving the other two dimensions. However, this change in conventional conductor width results in increased line capacitance. This is due to the conductor capacitance being approximately proportional to the conductor width and inversely proportional to the spacing between the conductor and the nearest voltage plane. As a result, capacitance of such conductor will increase by approximately 100%.

The present invention overcomes such problems by extending the height of the conductor, rather than conductor width. In so doing, it has now been found that with a conductor having dimensions of 100 microns width by 25 microns height and 150 microns away from a voltage plane, by increasing the height of the conductor to 50 microns, the current capability advantageously doubles while minimally increasing conductor capacitance, such as for example by approximately 20%. This increase or extension of the conductor height actually decreases the conductor distance from the voltage plane (i.e., from 150 microns to 125 microns) such that the conductor is now closer to the voltage plane to result in an acceptable increase, if any, in conductor capacitance.

Figure 2:
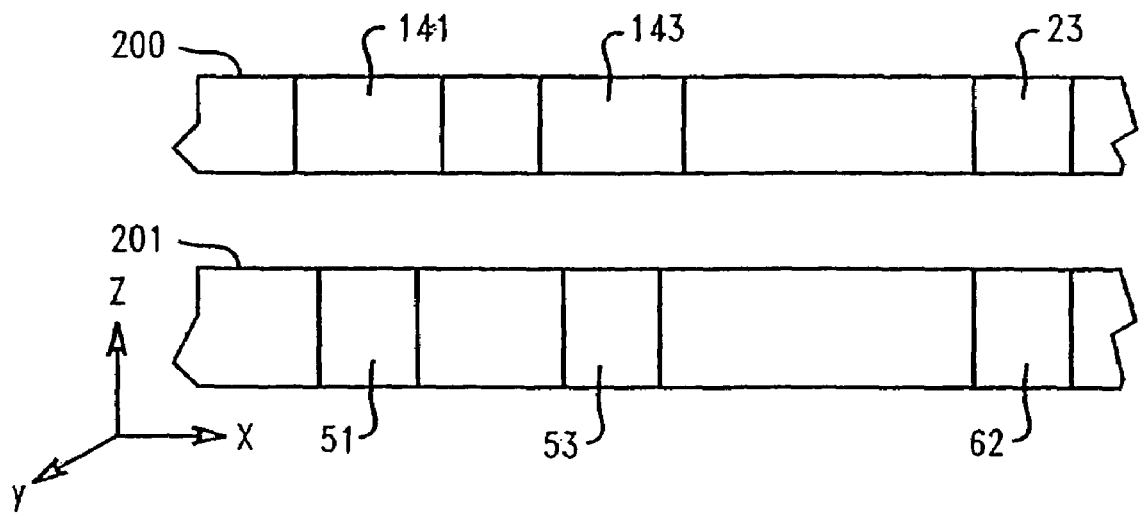
FIGS. 2A-C are vertical cross sectional views of a first method of the invention for forming the MLC of FIG. 1.
FIG. 2D is a horizontal cross sectional view of a portion of FIG. 2C, along section 2D-2D.
Figure 2:
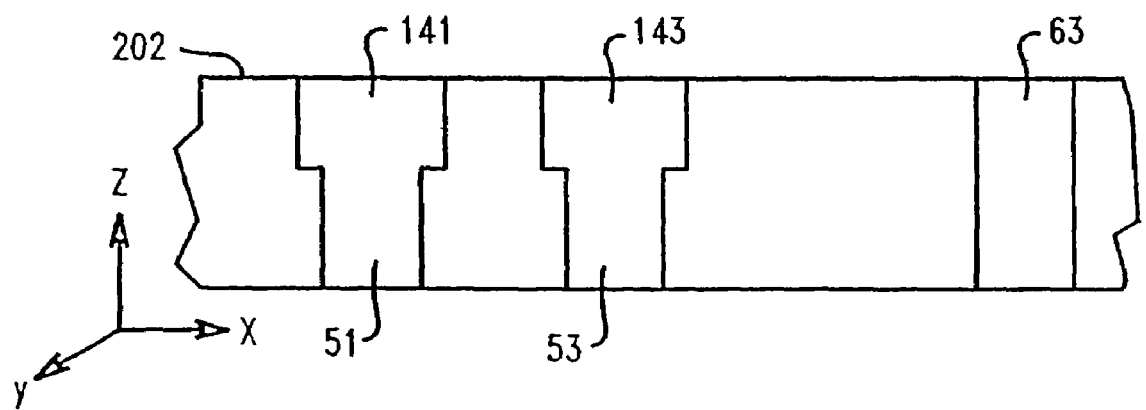
Figure 2C:
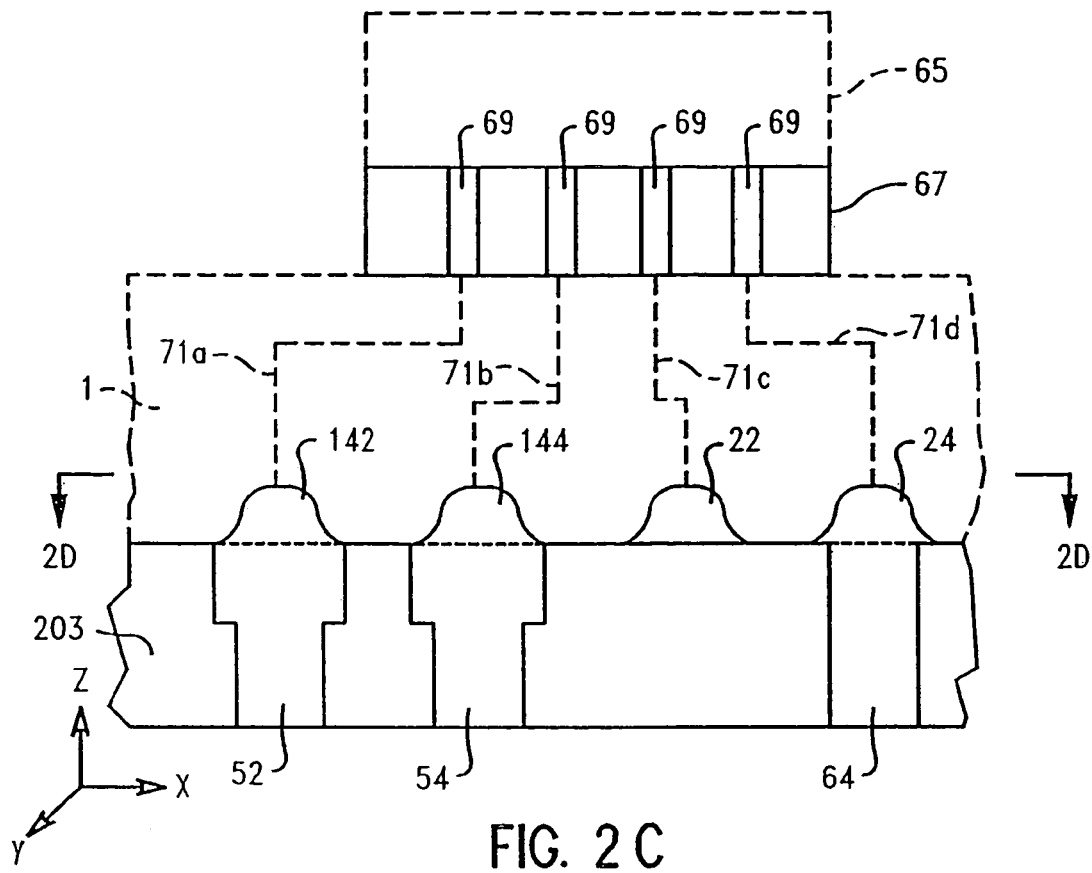

To illustrate the method steps of forming an electronic package in accordance with the invention, reference is made to FIGS. 2A-4B. As shown in FIGS. 2A-2C the vertically extended cross sections of conductors 142 and 144 of the invention are formed using a plurality of individual sheets, preferably individual green sheets. In so doing, reference is made to layer 3 of substrate 10, which includes both conductors 22 and 24, as well as the present extended conductors 142 and 144 of the invention.

A first green sheet 200 and a second green sheet 201 are provided for forming openings in the green sheets to create perforations in the green sheets with different geometrical dimensions and shapes as required for the desired electrical requirements of the final package. These openings may be mechanically machined, such as punched, into the green sheets. The first green sheet 200 is preferably a thin green sheet having a thickness of less than about 6 mils, preferably about 2 mils. The second green sheet 201 is preferably a thick green sheet having a thickness of greater than 6 mils.

The first, thin green sheet 200 is provided with channel openings 141 and 143, which correspond to a desired width, size or dimensions of the extended conductors 142 and 144 of the invention. The green sheet 200 is also provided with via opening 23 corresponding to conductor 22. In relation to the metallurgic features within layer 3, the second, thick green sheet 201 is provided with via openings 51, 53 and 62 corresponding respectively to short via 52, short via 54 and long via 64.

The width of channel openings 141 and 143 are defined during the mechanical machining of these perforation types. Further, the length of channel openings 141 and 143 (the y-dimension extending into the plane of the sheet) are also defined during the mechanical machining process step. The vias 23, 51, 53 and 62 preferably all have the same diameter to facilitate the manufacturing process. Alternatively, via 23 may have a larger diameter than the underlying cylindrical via 62.

Once the desired channel and via openings are formed in green sheets 200 and 201, the two green sheets are laminated together at low pressure to form composite layer 202 as is depicted in FIG. 2B. Alternatively, the green sheets 200 and 201 may be sublaminated together, which allows for the alignment between the various openings in green sheets 200 and 201. For example, after sublamination, the resulting layer 202 will have a new long via opening 63 resulting from the alignment between via openings 23 and 62 from layers 200 and 201 respectively. Also, layer 202 will have channel opening 141 joined to sort via opening 51 and channel opening 143 joined to short via opening 53.

Figure 2D:
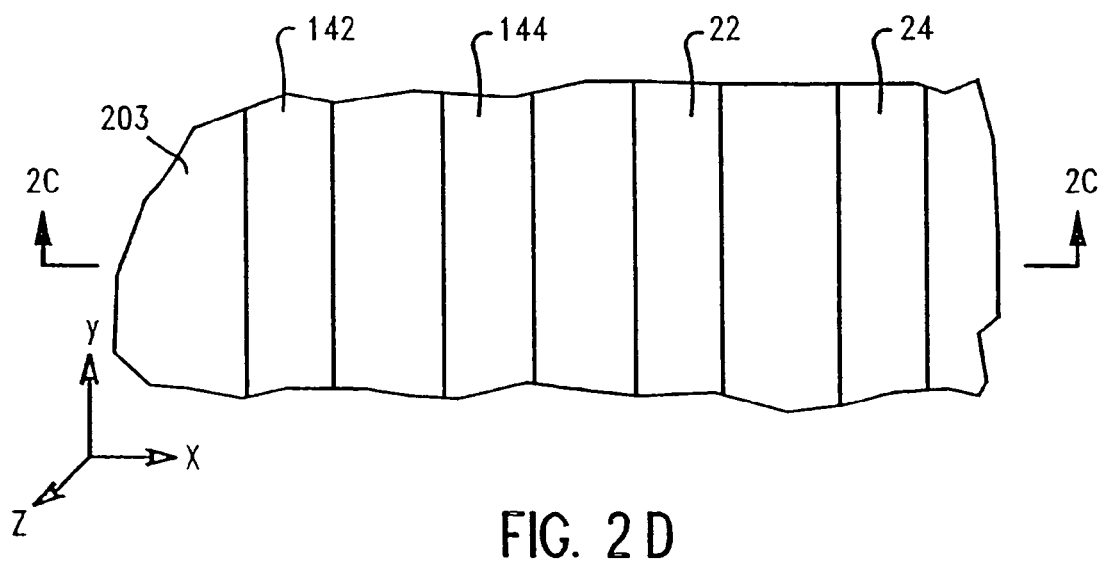

Referring to FIGS. 2C and 2D, upon completion of lamination, or sublamination, the green sheet layer 202 is screened with electrically conductive metallurgical paste to at least fill all openings in the green sheet layer 202 to form a metallized green sheet layer 203 as is shown. Optionally, this metallization fill step may be accomplished with use of a metal mask or the like. In so doing, the conventional conductive lines 22 and 24 are screened onto and above a surface of green sheet 203, while the extended conductors of the invention are screened directly into the green sheet as well as onto and above the green sheet surface, such that these extended conductors have a depth extending into the green sheet. Conductors 22, 24 and the portion of conductors 142, 144 above green sheet 203 form the grid that would normally match the integrated circuit. However, the conductors 142, 144, in accordance with the method of the invention, are extended vertically, in the z-direction, into the green sheet. Green sheet layer 203, containing the desired metallurgy consisting of the vertically extended conductive lines 142, 144 and the conventional, non-vertically extended conductive lines 22, 24, is then laminated or otherwise connected to redistribution layer 1 (FIG. 2C). Redistribution layer 1 contains internal conductors 71a, 71b, 71c, 71d that electrically connect the conductive lines 22, 24, 142, 144 to the densely packed vias 69 of connector 67 that connects to integrated circuit 65.

After lamination and sintering, resultant metallized green sheet layer 203 has a variety of metallurgical features including those of layer 3 of substrate 10 in FIG. 1. In particular, the green sheet 203 includes conventional cross-section metal paste line 22 on a top surface of layer 203, which is not visibly connected to a bottom surface of layer 203, and another conventional cross-section metal paste line 24 on the top surface which is connected to the bottom surface through metal paste filled long via 64. Further, the metallized green sheet layer 203 also includes the present extended cross-section metal paste conductor channels 142 and 144 that are connected to the bottom of layer 203 through metal paste filled short vias 52 and 54. It should be appreciated that additional layers, such as layers 5, 7 and 9 of substrate 10, may be formed in accordance with the process of the invention, as described above, and subsequently stacked, laminated and sintered together to result in substrate 10, or any of a variety of electronic packaging.

Figure 3A:
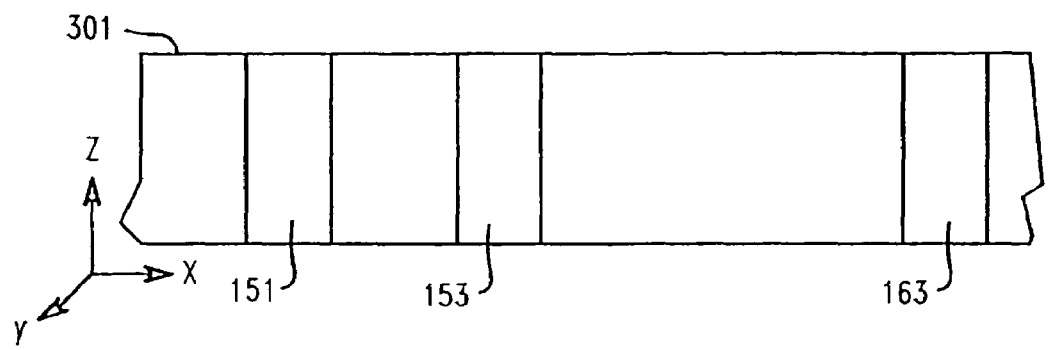
FIGS. 3A-C are vertical cross sectional views of a second method of the invention for forming the MLC of FIG. 1.
Figure 3B:
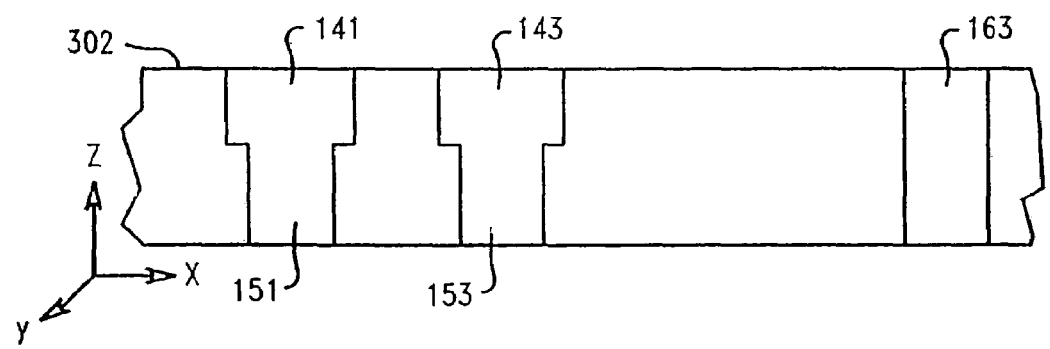
Figure 3C:
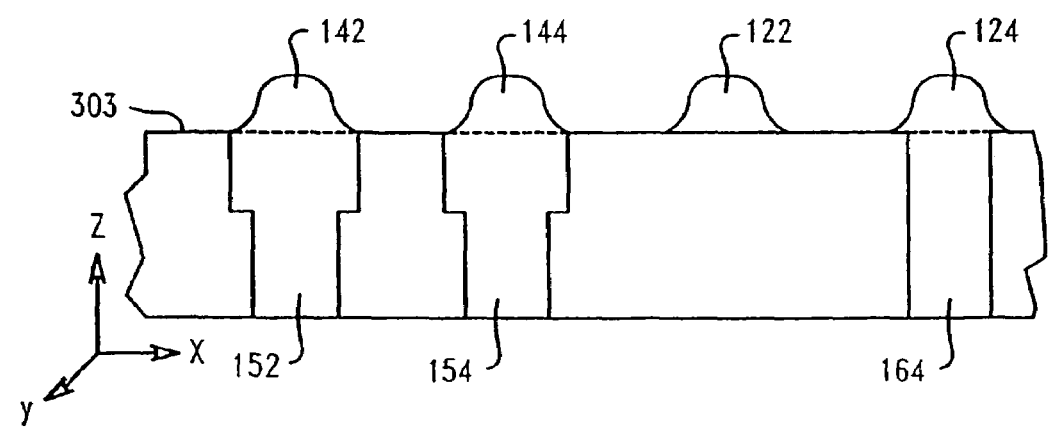

FIGS. 3A-3C illustrate an alternate method of forming the present vertically extended cross-section metal paste conductors 142, 144, 146, 136. A single green sheet 301 may be first provided with long via openings 151, 153 and 163. Preferably, this single green sheet has an original desired thickness, such as that of layer 3 of substrate 10. In so doing, this single green sheet avoids the need of being laminated to a second green sheet to form a single green sheet, such as green sheet 2B, having a desired thickness, such as the thickness of layer 3 of substrate 10.

Once the via openings are formed, the single green sheet 301 is transformed to single green sheet 302 having the vertically extended channel openings of the invention. Vertically extended channel openings 141 and 143 correspond to a desired size/dimensions of conductors 142 and 144, and are selectively formed within portions of selected ones of the via openings 151, 153 and 163. This may be accomplished by laser ablation, CNC drilling, sand blasting, water knife, photo processing or any similar processing technique.

As is shown in FIG. 3B, channel openings 141 and 143 are selectively formed at a top surface of via openings 151 and 153, respectively. Again, any known mechanical machining may form these openings, whereby the width and length of the vertically extended channel openings 141 and 143 are defined during mechanical machining. The single green sheet 302 is then screened with a metal paste to at least fill the openings formed therein such that a single green sheet 303 is formed, which is substantially equivalent to green sheet 203 of FIG. 2C, as described in detail above. This single green sheet 303 having the present conductors may then be stacked, laminated and sintered together with other metallized green sheets, such as in the manner described previously, to result in substrate 10, or any of a variety of electronic packaging.

Figure 4A:
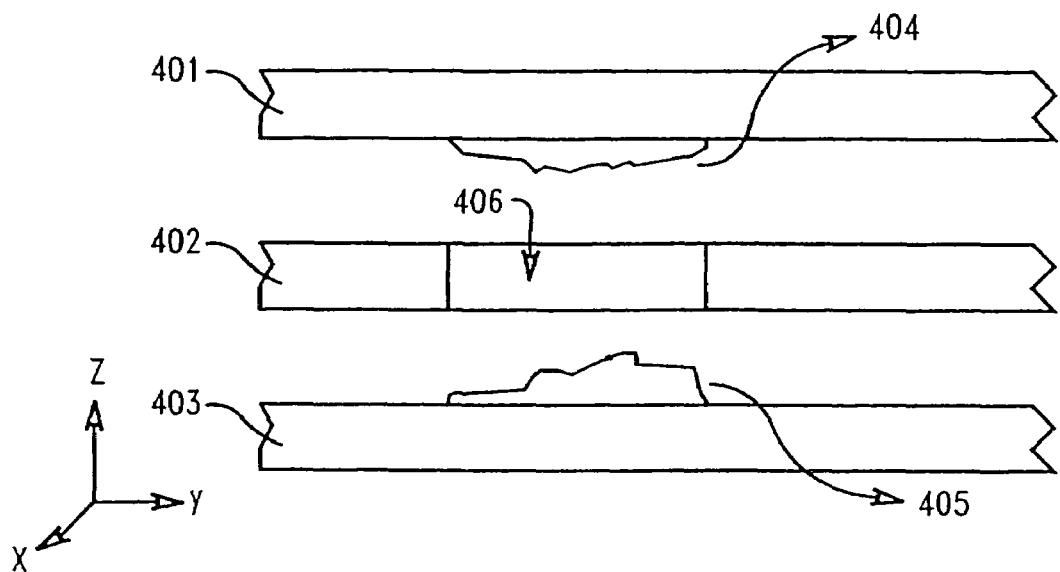
FIGS. 4A-B are vertical cross sectional views illustrating a method of forming the vertically extended lines of the invention as shown in the MLC of FIG. 1.
Figure 4B:
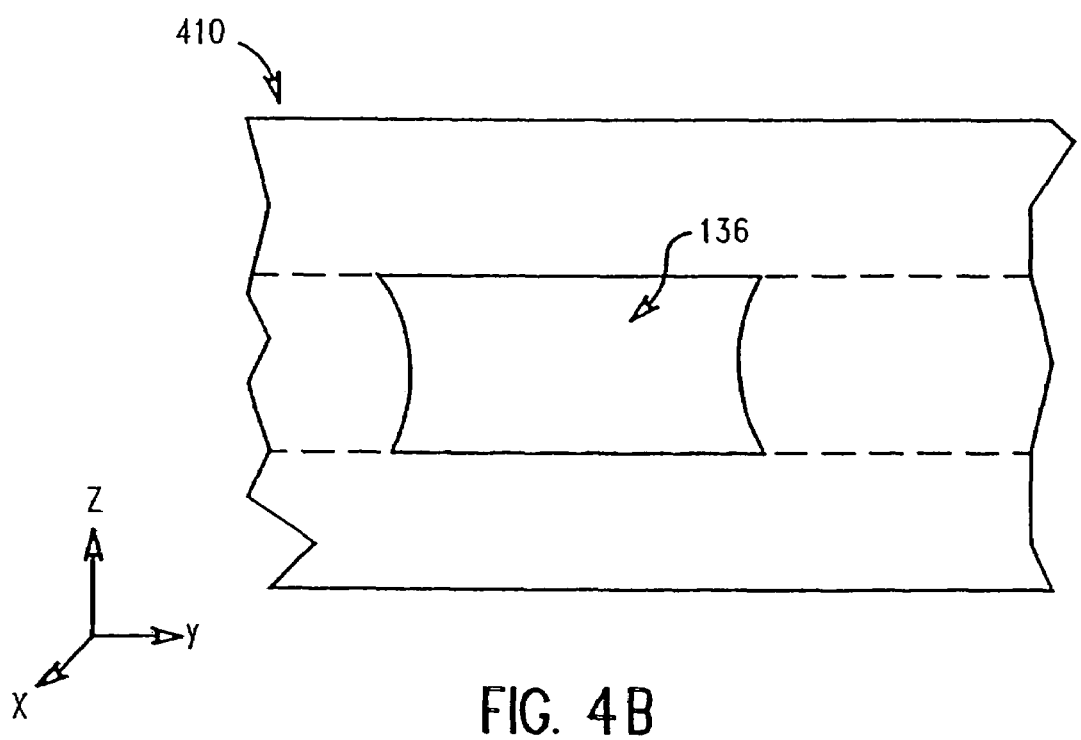

FIGS. 4A-B illustrate method steps of forming extended vertically extended conductor lines 136 in accordance with the invention. In so doing, reference is made to a portion of layers 5 and 7 of substrate 10, particularly to a portion of extended vertically extended conductor line 136. A first green sheet 401, second green sheet 402 and third green sheet 403 are provided, whereby the second green sheet 402 resides between the first and third green sheets 401, 403. Metallization lines 404 and 405 are respectively screened onto the surfaces of the first and third green sheets 401, 403. The second green sheet 402 is provided with an extended channel opening 406. The three green sheets 401, 402, 403 are then laminated together such that the metallization lines 404, 405 fill the present extended channel opening 406, without independently or directly screening metallization into opening 406, to form green sheet 410 having an vertically extended conductor line 136 having a length extending into the plane of the sheet in the x-direction and an extended height in the z-direction. That is, the metal is merely extruded from the top and bottom green sheets into the vertically extended channel openings within the middle green sheet. Again, resultant green sheet 410 represents a portion of extended conductor 136 within layers 5 and 7 of substrate 10.

Figure 5:
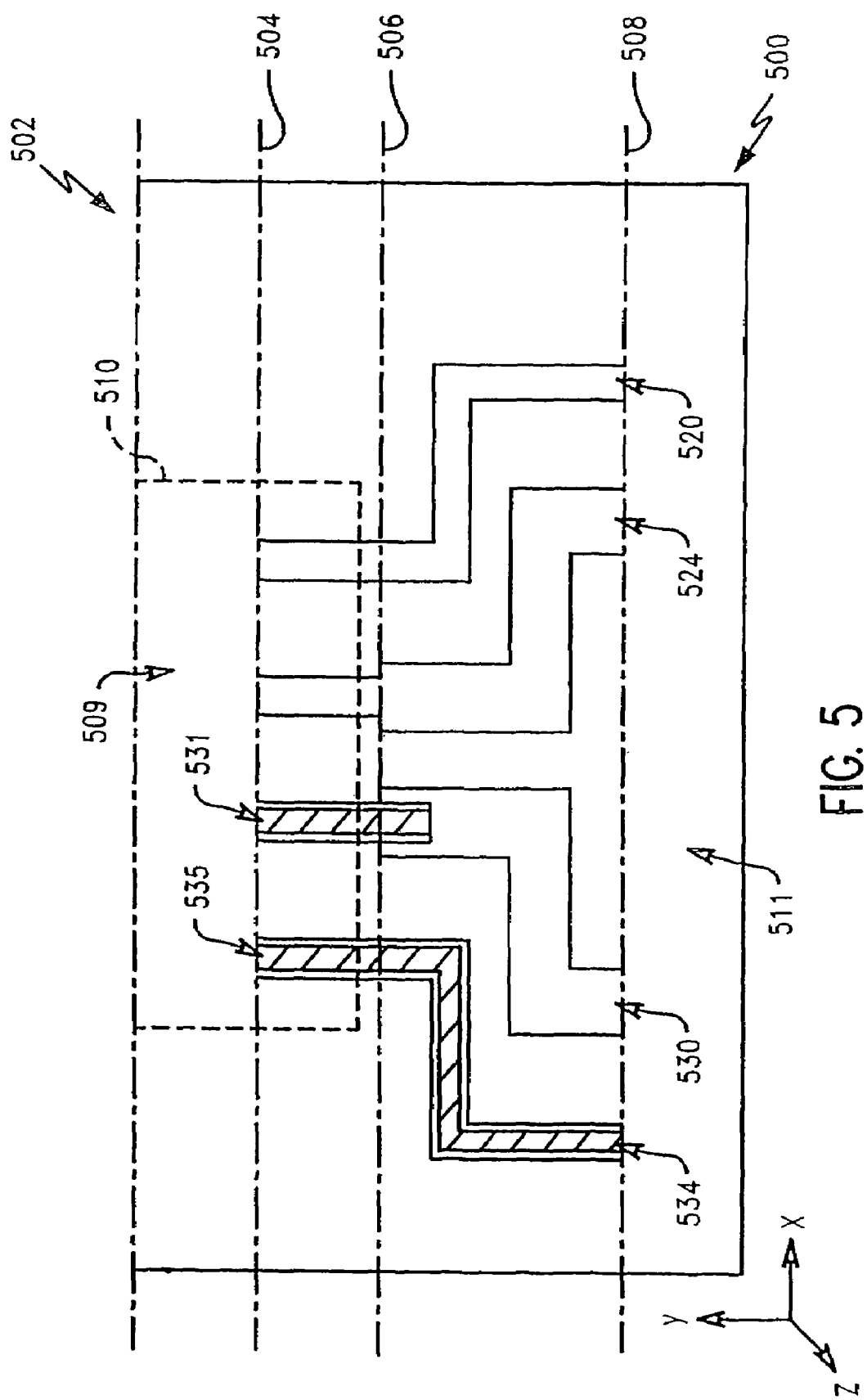
FIG. 5 is a horizontal cross sectional view of another example of an electronic package formed in accordance with the invention having both conventional conducting lines as well as the vertically extended conducting lines of the invention.

To better illustrate the advantage of fabricating conductor lines with the present extended cross-sections, FIG. 5 illustrates a cross-sectional view of an example of the invention using an alumina MLC package having a variety of conductor lines including both conventional conductor lines as well as extended conductor lines of the invention. As is shown, all conductor lines of the alumina MLC package are of equal total length. To provide an adequate electrical interconnection function, the electrical package conductors need to meet a prescribed line impedance, typically in the range of 30 to 60 Ohms. This line impedance includes three additive components, namely, the total line resistance, line capacitance, and line inductance. Each of these three components are in some manner dependent on the line geometry, package design features, and materials physical and electrical characteristics. In this example, and mainly for purpose of illustration, to meet a prescribed line impedance of 50 Ohms, the total line resistance must be limited to a maximum of 4 Ohms.

In more detail, the MLC package of FIG. 5 depicts a half portion of substrate 500 with middle plane section 502. Dashed line 510 depicts the boundary between the package center region 509 having a high density of connecting vias, and the package periphery region 511 having a low density of connecting vias. The package also includes four conducting lines 520, 524, 530 and 534, whereby conducting lines 520 and 524 are conventional conducting lines, while conducting lines 530 and 534 are vertically extended conducting lines in accordance with the invention.

As is shown, these four conducting lines 520, 524, 530 and 534, are of equal lengths, but differing line cross-sections as viewed in the x-z plane. They reside within both the package periphery region and extend into the package center region. In so doing, each of the four conducting lines 520, 524, 530, 534, interconnect a via on section 504 from the substrate center region 509 with high via density to a via on section 508 in the package periphery region 511 with low via density.

Between section planes 504 and 506, conductor line widths are minimal to accommodate for the high via density residing within the package center. As the conductor line extends into the periphery region of the substrate, such as between section planes 506 and 508, the conductor line width may be maintained such that it is narrow inside and outside the package center region, as is shown in relation to conductor line 520. Alternatively, referring to conductor line 524, as the conductor line extends into the periphery region of the substrate, such as between section planes 506 and 508, the conductor line width may increase in order to reduce the total line resistance.

Referring now to the extended conducting lines of the invention, namely conducting lines 530 and 534, at least a portion of such lines have been vertically extended in the z-direction in accordance with the invention. In particular, extended conducting line 530 has at least a portion thereof vertically extended between section planes 504 and 508. That is, conductor 530 line-width matches the width of conductor 524, but a small segment or portion of conductor 530 has been vertically extended with additional metallurgy 531 in accordance with the invention. Alternatively, extended conductor 534 has a vertically extended line cross-section through the entire length of the conductor with the addition of metallurgy 535.

In this example of FIG. 5, the distance between section planes 504 and 506 is about 10 mm, while the line distance between section planes 506 and 508 is about 30 mm. Thus, for a via array having 70 micron vias in a 150 micron via to via pitch, the lines should not exceed beyond about 50 microns in width to allow for typical processing tolerances and practical manufacturing yields. The measured resistance of such conventional narrow lines, which are typically made from Molybdenum metal and other non-conducting solid fillers, is 244 mOhms/mm, while a line outside the high density center and with higher width and the same metallurgy has an approximate resistance of about 80 mOhms/mm. In comparison, the present invention advantageously provides a narrow line width with extended cross-section having equal width and 50 microns depth, whereby such line has an approximate resistance of only about 48 mOhms/mm.

In order to better compare the results of the present invention, the following is a comparison of feature resistances within FIG. 5. In view of the above resistance measures, the resistance measures equate to conventional conductor line 520 having a resistance of about 9.8 Ohms and conventional conductor line 524 having a resistance of about 4.8 Ohms. However, the resistance measures of the present extended conducting lines are significantly reduced. In particular, partially vertically extended conductor line 530 has a resistance of about 2.9 Ohms, while entirely vertically extended conductor line 534 has a resistance of about 1.9 Ohms.

Thus, to meet the given maximum line resistance of 4 Ohms, a package using wiring geometry like that of conventional conductor line 520 will have to reduce its size by about 60% relative to the package size used to define this example. In other words, the maximum line length will have to be reduced by about 60%. This restriction will have a direct impact to the package interconnecting capability. If the package uses conventional conductor line 524, then the impact is lower as the line and package size need to be reduced only about 20%. In contrast, a package using wiring with geometry like partially vertically extended conductor line 530 of the invention can have a larger line length and/or larger package size, but no more than 30% larger than the package size used in this example. Most advantageously, a package built using wiring with geometry like that of the present entirely vertically extended conductor line 534 can have lines and/or package sizes twice as large as the package in this example, and hence, advantageously providing approximately a 300% increase in the package interconnecting capability.

Figure 6A:
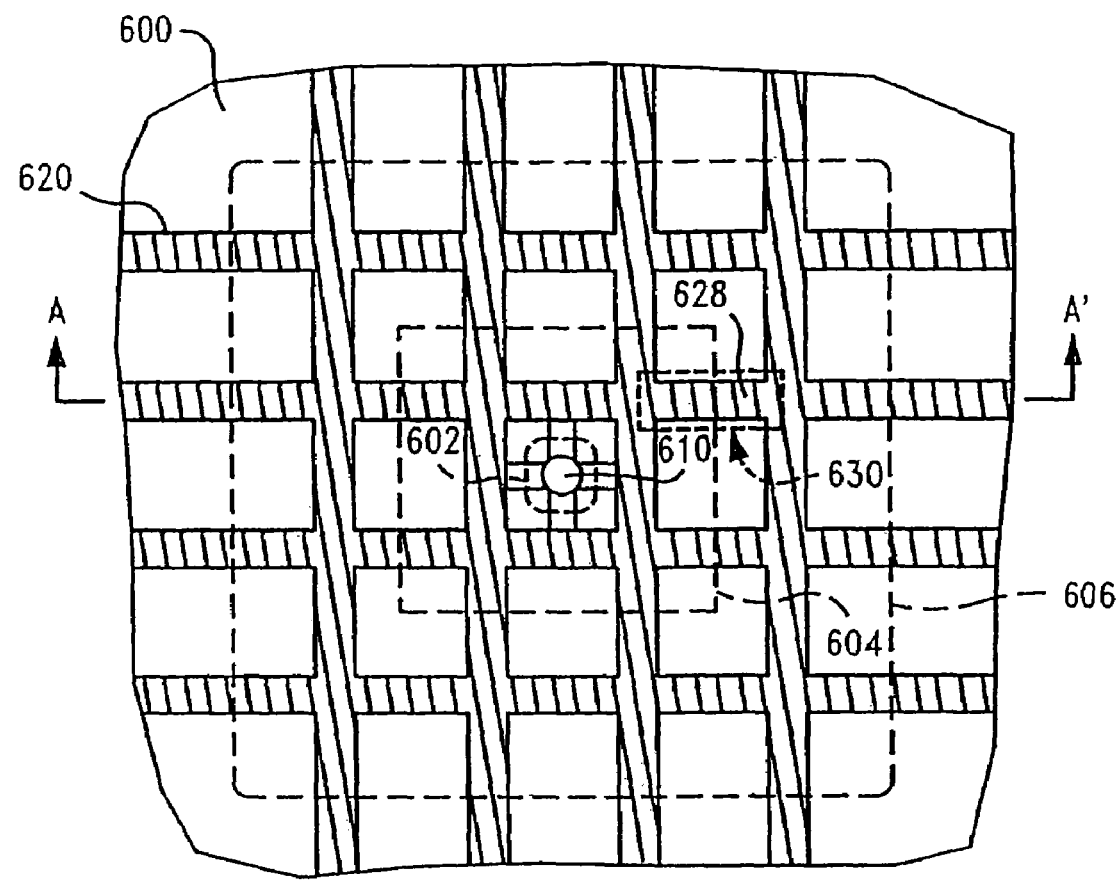
FIG. 6A is a partial top plan view of a voltage layer having a metallurgical grid and a power via whereby at least one segment of the metallurgical grid is vertically extended in accordance with the invention such that the total resistance across the metallurgical grid is reduced to improve the current carrying capability of such metallurgical grid.
Figure 6B:
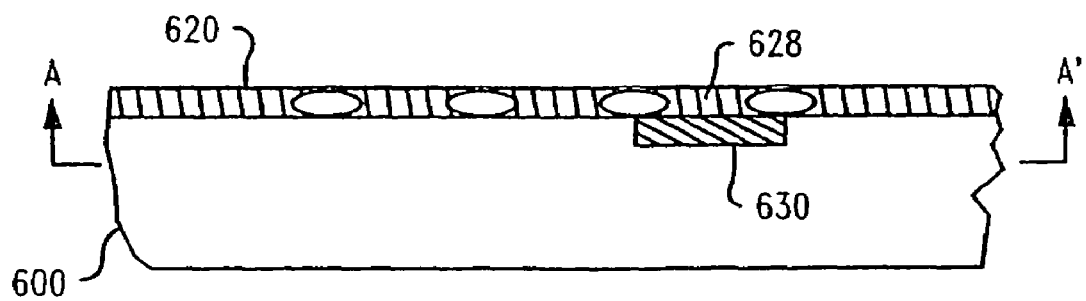
FIG. 6B is a partial vertical cross-sectional view of the voltage layer of FIG. 6A along line A-A'.

In addition, to increase the current carrying capability of conducting lines as described above, the extended cross-section conducting lines of the invention can also be used to enhance the current carrying capability of voltage and ground planes. Referring to FIGS. 6A-B, a partial top plan view and partial cross-sectional view, respectively, of a voltage layer 600 are shown including conducting metallurgical grid 620, and connected to power via 610 which is connected to a power source (not shown). It should be appreciated that other connected and/or not connected vias are not shown in this example. Dashed lines 602, 604, and 606 of FIG. 6A are drawn entirely around power via 610 for ease of understanding and explaining the electrical analysis of voltage layer 600.

Considering R to be the resistance of any of the metallurgical grid 620 segments, the resistance of all segments crossed over closed path 606 is then approximately R/16 since there are sixteen parallel short segments crossing this closed path 606. Similarly, the resistance of all segments crossed in closed path 604 is approximately R/8, or twice the resistance of closed path 306. Thus, moving away from the power via 610 results in a continuously decreasing total resistance for the total aggregate of segments in each additional closed path around the power via 610, and each step reducing the total resistance continuously relative to the resistance from the previous and adjacent path.

The only exception to this particular total resistance trend applies to closed path 602, primarily due to the local differences in grid geometry needed to connect the power via 610 to the metallurgical grid 620. As the closed path 602 is adjacent to the power via 610, it crosses over segments shorter than typical segments, hence with the resistance of all segments crossed in closed path 602 being approximately R/4, and each segment with resistance of approximately R/3; thus, the expected resistance of all short segments crossing path 602 is about R/12. Thus in a typical voltage layer 600, the current capability of a power via 610 is locally limited by the increasing resistance of the metallurgical grid 620 in the region near the power via 610.

In accordance with the invention, the current carrying capability of the metallurgical grid 620 around power via 610 is improved by vertically expanding a cross section of at least a portion of such metallurgical grid 620 with addition metallurgy 630. This may be accomplished in accordance with the present method steps as described in more detail above. FIG. 6A illustrates a top plan view of this additional, expanding metallurgy 630 in relation to segment 628 of the grid 620. FIG. 6B illustrates a cross-sectional view of the additional, expanding metallurgy 630 along line A-A' of FIG. 6A. In the present invention, wherein the extended metallurgy 630 expands a cross section of conducting line segment 628, such as by increasing line segment 628 vertically 3 times; then, rather than line segment's 628 electrical resistance being the conventional R along closed path 604, the vertical expansion of the invention advantageously provides this extended cross section line segment 628 such that its electrical resistance is now beneficially reduced to R/3. If all other segments in the same closed path 604 are also transformed in accordance with the invention, like segment 628, then the total resistance of the segments in path 604 will become R/24 in comparison to the conventional total resistance of R/8. Thus, the present invention easily, efficiently and affordably expands the current flow into power via 610 without the need to expand the cross-section of many of the segments of metallurgical grid 620.

Figure 7A:
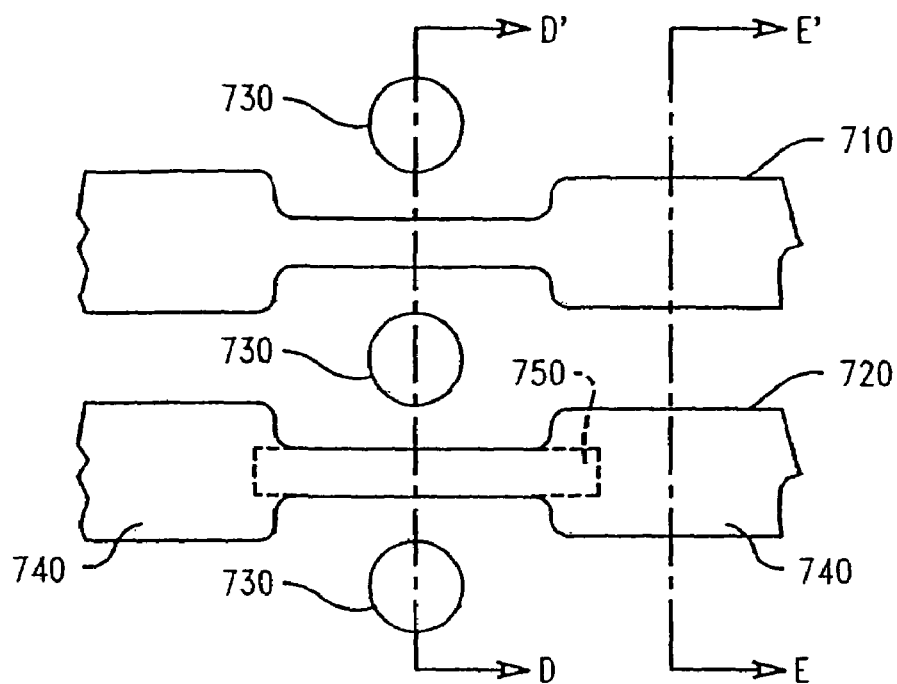
FIG. 7A is a top plan view of a portion of an electronic package having partially vertically extended conductors of the invention.
Figure 7B:
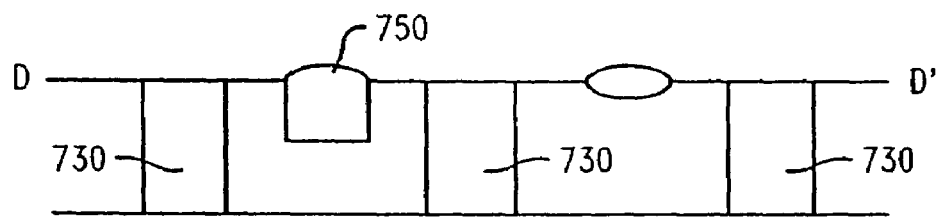
FIG. 7B is a partial vertical cross-sectional view along line D-D' of FIG. 7A.
Figure 7C:
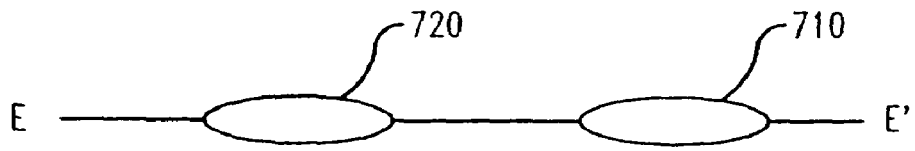
FIG. 7C is a partial vertical cross-sectional view along line E-E' of FIG. 7A.

FIGS. 7A-C illustrate partially vertically extended conductors of the invention for the fabrication of packages with conductors of approximately constant cross-sectional area in those regions where conventional packages can not provide such functionality, i.e., where the via density is high. Referring to FIG. 7A, two conductors, namely partially vertically extended conductor 720 and conventional conductor 710 are shown in plan views traversing a plane with high density vias 730. Given the small spacing between vias, both conductors are screened with a narrow segment to maintain the line to via allowed space tolerances required for MLC fabrication. The partially vertically extended conductor 720 includes a conventional segment 740 and an extended segment 750. In this example, the cross section of the extended segment 750 is defined by design to be approximately equal to the cross sectional area of the conventional conductor 710. This is approximately illustrated in FIGS. 7B and C. In contrast, the conventional conductor cross-sectional area is approximately reduced by 50% when traversing the region of high via density. Constant cross-section is a required electrical characteristic for signal lines which need to operate at very high frequencies, like over one GHz. Any change in cross-sectional area on high frequency lines will result in increased wave reflection and higher signal noise. The extended conductors resolve this problem.

Figure 8A:
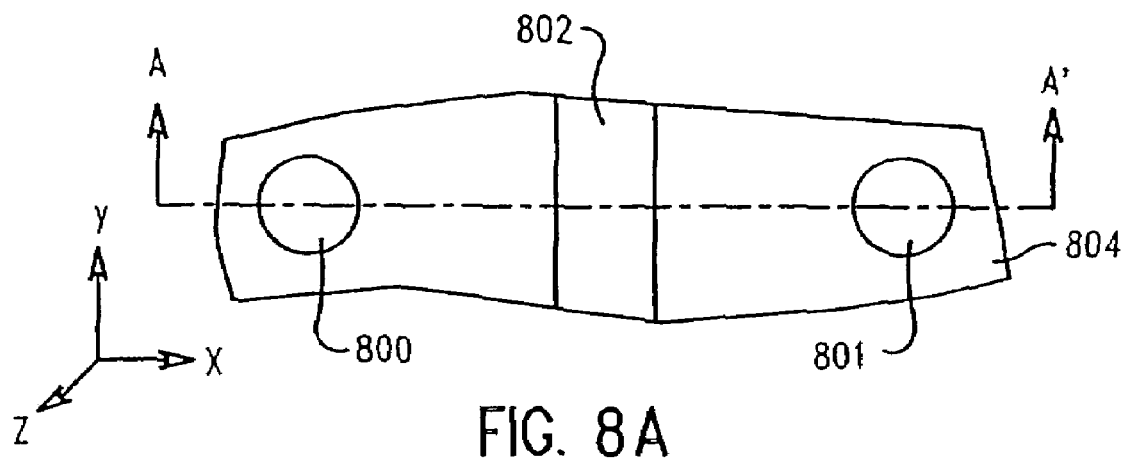
FIG. 8A is a top plan view of a portion of an electronic package having a conventional conductor between two vias for processing in accordance with the invention.
Figure 8B:
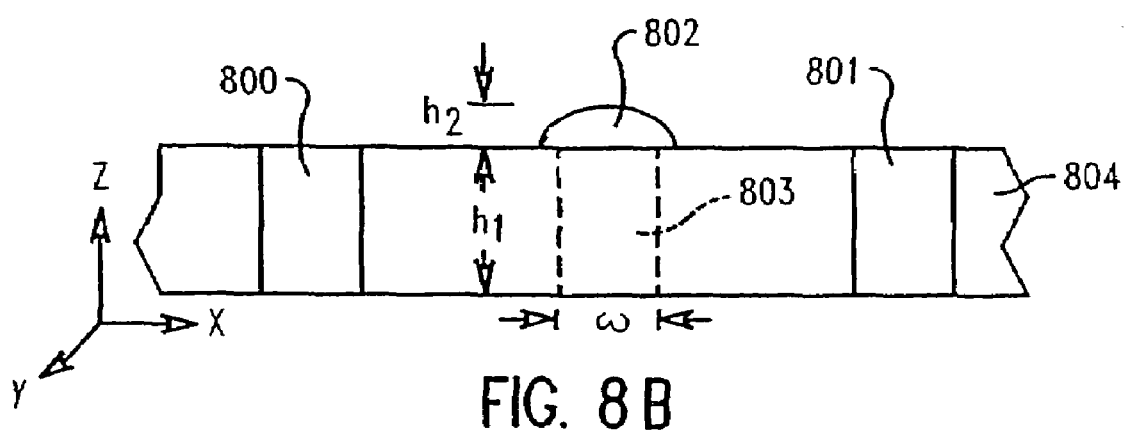
FIG. 8B is a partial vertical cross-sectional view along line A-A' of FIG. 8A showing a vertically extended conductor of the invention.

In FIGS. 8A and 8B, a conventional conductor 802 resides between vias 801 and 800. As shown, the conductor resistance of this conventional conductor 802 is restricted. The invention overcomes this problem by providing an extension for forming a vertically extended conductor 803 of the invention (FIG. 8B). Both conductor 802 and vertically extended conductor 803 have lengths extending in the y-direction, which is in the plane of the dielectric layer 804 (and perpendicular to the plane of view as shown in FIG. 8B) and widths w also in the dielectric layer plane, but normal to the length. Vertically extended conductor 803, extending in the z-direction normal to the width and length of conductor is contained within dielectric layer 804 to improve the conductor cross-sectional area by increasing the conductor 802 height $h_2$ by conductor 803 height $h_1$, to $h_1+h_2$. This increases the aspect ratio of the conductor, i.e., the ratio of conductor height to width. The thickness of the dielectric layer (z-direction) can be above 50 microns, so that in practice, the aspect ratio may be greater than or equal to 0.5, or even 1. The resultant structure is a reliable vertically extended conductor 803 having reduced resistance with increased aspect ratio for allowing an increase in signal lines due to grid reduction and distance between signal vias.

It is customary in package design to have a known and specific package impedance, in order to have reliable package to IC interconnect and performance. In general, capacitance of the package is fixed for a given dielectric material as it is a function of the dielectric constant of the matrix and the line width of the conductor. Since current and frequency operations are generally fixed for a given IC design, inductance of the package is also fixed. However, both capacitance and inductance increase steadily, and hence, the package signal shrinks. So in the given equation R+C+In=Im, if Im (Impedance) is fixed, C (Capacitance) and In (inductance) will increase steadily for performance of the IC. Thus, the only variable that must be controlled is R (conductor resistance). As via to via spacing and via to line spacing continue to shrink, R becomes more difficult to control. The present invention advantageously addresses and solves this problem by providing the present vertically extended conductors.

While the present invention has been particularly described, in conjunction with a specific preferred embodiment, it is evident that many alternatives, modifications, and variations will be apparent to those skilled in the art in light of the foregoing description. It is therefore contemplated that the appended claims will embrace any such alternatives, modifications, and variations as falling within the true scope and spirit of the present invention.

Thus, having described the invention, what is claimed is:

1. A method of forming an electronic package for mounting integrated circuits comprising:
   providing a grid that matches an integrated circuit, the grid having a conductor with a cross section normal to a length of the conductor; and
   vertically extending a height of at least a portion of the cross section of the conductor by:
   providing a first dielectric layer;
   forming an opening in said first dielectric layer corresponding to at least a portion of the length of the conductor;
   depositing metallurgy to fill said opening in said first dielectric layer; and
   attaching said first dielectric layer to said grid such that the filled opening is aligned to the conductor for vertically increasing at least a portion of said cross section of said conductor within said first dielectric layer, said increased cross section providing said grid with an enhanced current carrying capability of voltage and ground planes.

2. The method of claim 1 wherein said first dielectric layer comprises a green sheet.

3. The method of claim 1 wherein said conductor and said opening in said first dielectric layer have the same size cross sections.

4. The method of claim 1 wherein said conductor and said opening in said first dielectric layer have differing widths.

5. The method of claim 1 further including the steps:
   providing a second dielectric layer;
   forming an opening in said second dielectric layer;
   positioning said first and second dielectric layers such that said opening in said first dielectric layer is aligned to said opening in said second dielectric layer;
   attaching said first and second dielectric layers to each other to form a laminated dielectric layer having an aperture;
   depositing said metallurgy to fill said aperture; and
   attaching said laminated dielectric layer to said grid such that said filled aperture is aligned to the conductor for vertically extending said cross section of said conductor into said laminated dielectric layer.

6. The method of claim 5 wherein said first and second dielectric layers comprise first and second green sheets.

7. The method of claim 6 wherein said first and second green sheets are sublaminated to each other to permit alignment between the green sheets.

8. The method of claim 5 wherein said opening in said first dielectric layer and said opening in said second dielectric layer have differing sizes.

9. The method of claim 5 wherein said opening in said first dielectric layer and said opening in said second dielectric layer have the same size.

10. The method of claim 5 wherein said first dielectric layer has a thickness of less than about 6 mils.

11. The method of claim 10 wherein said second dielectric layer has a thickness of greater than 6 mils.

12. The method of claim 1 including the steps:
providing said first dielectric layer having an original desired thickness;
forming a vertically extended opening in said first dielectric layer by forming a second opening in a location corresponding to and above the first opening, said second opening being larger than said first opening;
depositing said metallurgy over said first dielectric layer to fill said vertically extended opening; and
attaching said first dielectric layer to said grid such that said filled vertically extended opening is aligned to the conductor for vertically increasing said portion of said cross section of said conductor.

13. The method of claim 1 further including the steps:
providing a second dielectric layer;
providing a third dielectric layer underlying said second dielectric layer;
providing a fourth dielectric layer underlying said third dielectric layer;
forming an extended channel opening in said third dielectric layer;
applying metallurgy to said second and fourth dielectric layers in locations corresponding to said extended channel opening in said third dielectric layer;
attaching said second, third and fourth dielectric layers to each other to form a laminated layer such that said metallurgy is extruded into the extended channel opening to form an extended conductor line within said laminated layer; and
attaching the laminated layer to said grid such that said extended conductor line is aligned to at least one of said filled opening or said conductor for vertically increasing said portion of said conductor cross section.

14. The method of claim 1 wherein said vertically extended cross section of said conductor expands a current capability of said integrated circuit.

15. The method of claim 1 wherein only a portion of said cross section is vertically increased.

16. The method of claim 1 wherein an entire length of said cross section is vertically increased.

17. A method of forming an electronic package for mounting integrated circuits comprising:
providing a metallurgical grid of a dielectric body having a conductor with a cross section residing within said dielectric body;
providing a dielectric layer;
machining an opening through a thickness of said dielectric layer, said opening corresponding to at least a portion of a length of said conductor;
filling said opening with metallurgy;
aligning said filled opening in said dielectric layer to said conductor of said dielectric body; and
vertically increasing a height of said at least portion of said cross section of said conductor by attaching said dielectric layer to said dielectric body to form a vertically layered conductor comprising said filled opening in combination with said conductor.

18. The method of claim 17 wherein said cross section is restricted along a portion of a width thereof, whereby said filled opening increases said restricted width of said cross section in a vertical direction to allow increased current loads to be carried across voltage and ground planes of said metallurgical grid.

19. The method of claim 17 wherein an interface resides between said filled opening and said conductor of said vertically layered conductor.

20. A method of forming an electronic package for mounting integrated circuits comprising:
providing a dielectric body having a planar dielectric layer in contact with at least two metal interconnections for a specified metallurgical grid of said dielectric body;
providing a vertical opening in said dielectric layer, said opening located directly between and exposing at least portion of a cross section of each said at least two metal interconnections;
filling said opening with metallurgy for increasing a height of each said at least two metal interconnections and connecting said at least two metal interconnections to each other to form a vertically extended conductor within said dielectric body.

* * * * *